US012748509B2

(12) United States Patent
Haran et al.

(10) Patent No.: US 12,748,509 B2
(45) Date of Patent: Sep. 29, 2026

(54) CORRECTING FOR TOUCH-SCREEN COUPLING THROUGH DISPLAY ELECTRODE

(71) Applicant: Microsoft Technology Licensing, LLC, Redmond, WA (US)

(72) Inventors: On Haran, Kfar Saba (IL); Eliyahu Barel, Rosh-HaAyin (IL)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 18/262,609

(22) PCT Filed: Jan. 31, 2022

(86) PCT No.: PCT/US2022/014522
§ 371 (c)(1),
(2) Date: Jul. 24, 2023

(87) PCT Pub. No.: WO2022/169703
PCT Pub. Date: Aug. 11, 2022

(65) Prior Publication Data
US 2024/0077974 A1 Mar. 7, 2024

(30) Foreign Application Priority Data
Feb. 3, 2021 (NL) ..................................... 2027486

(51) Int. Cl.

| | |
|---|---|
| ***G06F 3/041*** | (2006.01) |
| ***G06F 3/044*** | (2006.01) |
| ***H10K 59/40*** | (2023.01) |

(52) U.S. Cl.
CPC .......... *G06F 3/0418* (2013.01); *G06F 3/0412* (2013.01); *G06F 3/04166* (2019.05); *G06F 3/0446* (2019.05); *H10K 59/40* (2023.02)

(58) Field of Classification Search
CPC ..................................................... G06F 3/0418
See application file for complete search history.

(56) References Cited

U.S. PATENT DOCUMENTS

| | | | |
|---|---|---|---|
| 6,297,811 | B1 | 10/2001 | Ravid et al. |
| 8,659,573 | B2 | 2/2014 | Haga et al. |
| 9,164,641 | B1 | 10/2015 | Rowe |

(Continued)

FOREIGN PATENT DOCUMENTS

| | | |
|---|---|---|
| EP | 2363788 A2 | 9/2011 |

OTHER PUBLICATIONS

U.S. Appl. No. 18/546,076, filed Feb. 10, 2022.

(Continued)

*Primary Examiner* — William Boddie
*Assistant Examiner* — Andrew B Schnirel
(74) *Attorney, Agent, or Firm* — Alleman Hall LLP

(57) ABSTRACT

A method to process touch input on a touch-screen display device having an electronic display layer arranged behind a series of column electrodes and behind a series of row electrodes. The method comprises: concurrently driving one or more row electrodes while leaving undriven one or more other row electrodes; sensing a row signal from the one or more other row electrodes; sensing a column signal from the series of column electrodes; and providing a corrected column output based at least partly on the column signal and on the row signal.

20 Claims, 10 Drawing Sheets

Y COORDINATE

(56) References Cited

U.S. PATENT DOCUMENTS

| | | | | |
|---|---|---|---|---|
| 9,189,116 | B2 | 11/2015 | Cheng et al. | |
| 9,391,610 | B2 | 7/2016 | Gourevitch et al. | |
| 10,146,360 | B2 | 12/2018 | Vandermeijden et al. | |
| 10,698,534 | B2 | 6/2020 | Bye | |
| 10,712,885 | B2 | 7/2020 | Bye | |
| 10,719,177 | B2 | 7/2020 | Pedersen et al. | |
| 2006/0267953 | A1 | 11/2006 | Peterson et al. | |
| 2010/0295813 | A1 | 11/2010 | Kent | |
| 2011/0115729 | A1 * | 5/2011 | Kremin | G06F 3/0446 345/173 |
| 2011/0216033 | A1 * | 9/2011 | Mamba | G06F 3/0446 345/174 |
| 2012/0327016 | A1 | 12/2012 | Hristov | |
| 2014/0232684 | A1 * | 8/2014 | Mamba | G06F 3/0418 345/174 |
| 2015/0002445 | A1 | 1/2015 | Brunet et al. | |
| 2015/0053459 | A1 | 2/2015 | Fried | |
| 2015/0109244 | A1 | 4/2015 | Jang et al. | |
| 2016/0092023 | A1 * | 3/2016 | Nakaya | G06F 3/0418 345/173 |
| 2016/0117054 | A1 * | 4/2016 | Mamba | G06F 3/047 345/174 |
| 2016/0147319 | A1 * | 5/2016 | Agarwal | G06F 3/044 345/173 |
| 2016/0188105 | A1 | 6/2016 | Kremin et al. | |
| 2017/0185182 | A1 * | 6/2017 | Chandran | G06F 3/04184 |
| 2019/0064962 | A1 | 2/2019 | Bye | |
| 2019/0102017 | A1 | 4/2019 | Kim et al. | |
| 2019/0204959 | A1 | 7/2019 | Ko et al. | |
| 2019/0302951 | A1 | 10/2019 | Shepelev et al. | |
| 2021/0026484 | A1 * | 1/2021 | Kim | G06F 3/04182 |
| 2021/0191544 | A1 | 6/2021 | Luo et al. | |
| 2024/0118770 | A1 | 4/2024 | Barel et al. | |

OTHER PUBLICATIONS

Lee, et al., "Mutual Capacitive Sensing Touch Screen Controller for Ultrathin Display with Extended Signal Passband Using Negative Capacitance", In Journal of Sensors, vol. 18, Issue 11, Oct. 26, 2018, 13 Pages.

"Search Report and Written Opinion Issued in Netherlands Patent Application No. N2027486", Mailed Date: Nov. 9, 2021, 12 Pages.

"Search Report and Wriiten Opinion Issued in Netherlands Patent Application No. N2027589", Mailed Date: Nov. 16, 2021, 14 Pages.

"International Search Report and Written Opinion Issued in PCT Application No. PCT/US22/014522", Mailed Date: Apr. 29, 2022, 13 Pages.

"International Search Report and Written Opinion Issued in PCT Application No. PCT/US22/070602", Mailed Date: May 3, 2022, 15 Pages.

Non-Final Office Action mailed on May 28, 2024, in U.S. Appl. No. 18/546,076, 20 pages.

Final Office Action mailed on Sep. 4, 2024, in U.S. Appl. No. 18/546,076, 19 pages.

Notice of Allowance mailed on Nov. 10, 2025, in U.S. Appl. No. 18/546,076, 08 pages.

Decision to grant a European patent pursuant to Article 97(1) received in European Application No. 22705001.0, mailed on Apr. 10, 2026, 2 pages.

* cited by examiner

CORRECTING FOR TOUCH-SCREEN COUPLING THROUGH DISPLAY ELECTRODE

CROSS REFERENCE TO RELATED APPLICATIONS

The present application is a U.S. National Phase of International Patent Application Serial No. PCT/US2022/014522 entitled "CORRECTING FOR TOUCH-SCREEN COUPLING THROUGH DISPLAY ELECTRODE", filed Jan. 31, 2022, which claims priority to Netherlands Patent Application Serial No. 2027486, filed Feb. 3, 2021, the entire contents of each of which are hereby incorporated by reference for all purposes.

BACKGROUND

Capacitive touch screens are used in electronic devices ranging from computer monitors and tablet computers to smartphones and other handheld devices. A capacitive touch screen may be capable of tracking touch or hover of a user's finger, of a stylus held in the user's hand, or of input devices of various other forms. In some implementations, capacitive touch-screen componentry is applied directly to the viewing surface of an electronic display, such as a liquid-crystal display (LCD) or an organic light-emitting diode (OLED) display. The resulting touch-screen display stack provides a basis for integrated display-and-input functionality.

SUMMARY

One aspect of this disclosure is directed to a touch-screen display device comprising a series of column electrodes and a series of row electrodes. The series of row electrodes crosses the series of column electrodes such that the electrical impedance at each crossing of a row and column electrode is responsive to the proximity of a touch input to that crossing. An electronic display layer is arranged behind the series of column electrodes and behind the series of row electrodes, and a row-drive circuit is configured to concurrently drive one or more row electrodes while leaving undriven one or more other row electrodes. A row-sense circuit of the touch-screen display device is configured to sense a row signal from the one or more other row electrodes; a column-sense circuit is configured to sense a column signal from the series of column electrodes; and a correction circuit is configured to provide a corrected column output based at least partly on the column signal and on the row signal.

Another aspect of this disclosure is directed to a method to process touch input on a touch-screen display device having an electronic display layer arranged behind a series of column electrodes and behind a series of row electrodes. The method comprises: concurrently driving one or more row electrodes while leaving undriven one or more other row electrodes; sensing a row signal from the one or more other row electrodes; sensing a column signal from the series of column electrodes; and providing a corrected column output based at least partly on the column signal and on the row signal.

This Summary is provided to introduce in simplified form a selection of concepts that are further described in the Detailed Description. This Summary is not intended to identify key features or essential features of the claimed subject matter, nor is it intended to be used to limit the scope of the claimed subject matter. The claimed subject matter is not limited to implementations that solve any or all disadvantages noted in any part of this disclosure.

DETAILED DESCRIPTION

As touch-screen display stacks become thinner, driven by modern design practice, certain issues emerge. One issue is that the dielectric layer that separates touch-screen electrodes from the common electrode of an underlying electronic display may itself be very thin. Extreme thinness of the dielectric layer (e.g., <30 micrometers (μm)) can result in strong capacitive coupling between the touch-screen and display electrodes at frequencies used to drive the touch-screen electrodes. More specifically, capacitive coupling via the common electrode of the display may provide an undesirable low-impedance path between the row electrodes excited by the touch-screen driver and the column electrodes through which the touch point is sensed. This low-impedance path contributes an undesired component to the signal from each column electrode, thereby decreasing the touch sensitivity of capacitive touch sensing.

The solutions presented herein leverage a row-driving scheme typically used in capacitive touch screens, where each row electrode is excited in a predetermined sequence while other row electrodes remain undriven. In the disclosed solutions, signal is sensed on one or more of the undriven row electrodes during the excitation sequence, in addition to signal from the column electrodes. By inference, the signal sensed on the undriven row electrodes (particularly on rows that are far from the touch point) is due primarily to capacitive coupling to the excited row electrode(s) via the common electrode of the display. It follows that the magnitude of the signal sensed on the undriven row electrodes will track the undesired component superposed on the column-electrode signal, as both components share the same origin. This inference enables a series of related methods to estimate the level of the undesired component based at least partly on the signal sensed on the undriven row electrodes. The undesired component of the column-electrode signal can be compensated in real time, resulting in improved touch sensitivity.

Figure 1:
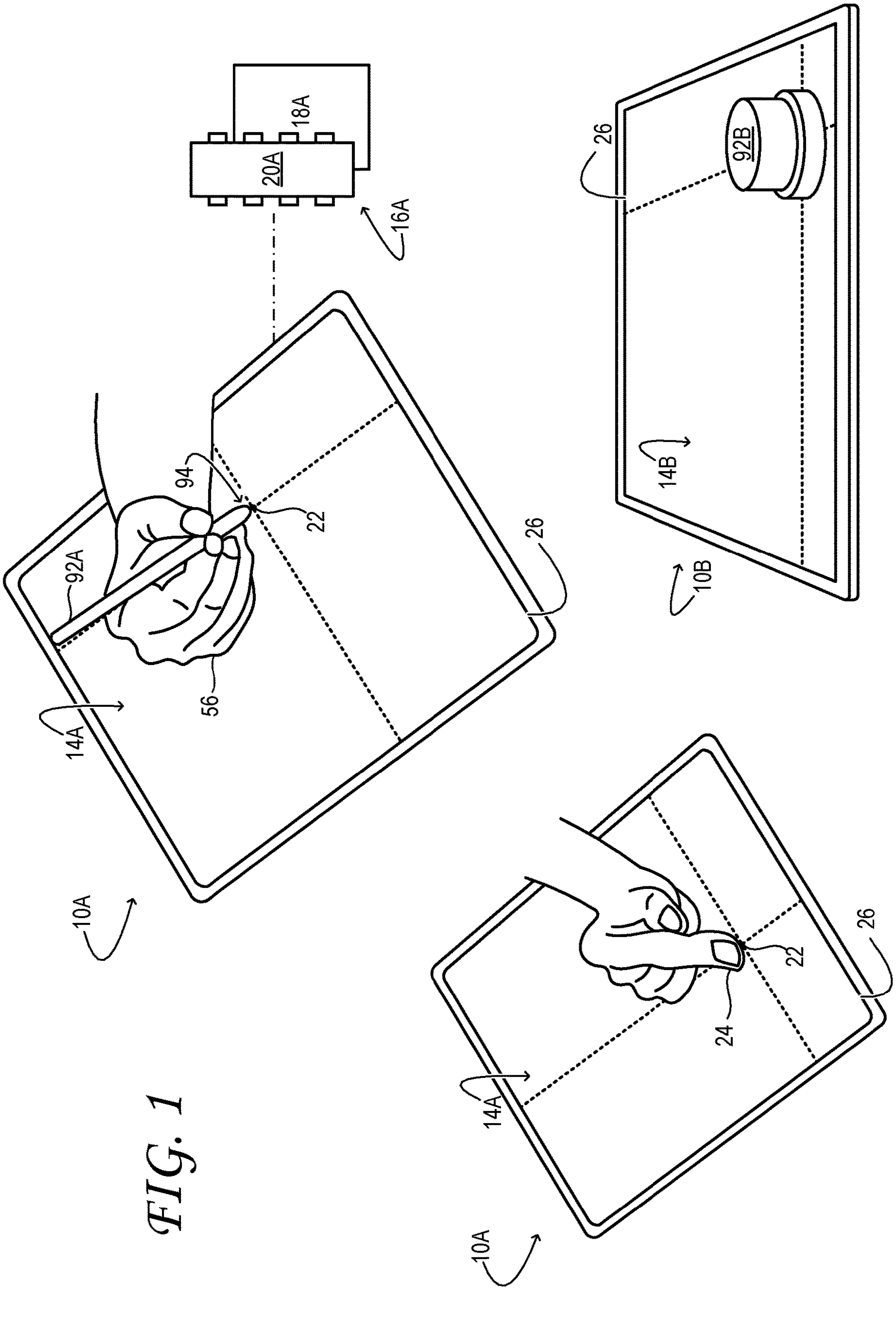
FIG. 1 shows aspects of an example touch-screen display device.

Turning now to the drawings, FIG. 1 shows aspects of an example touch-screen display device 10A. Touch-screen display device 10A is a tablet computer system comprising an electronic display 14A and an integrated computer 16A.

In other examples, a touch-screen display device may take the form of a smartphone, handheld game system, laptop computer system, all-in-one computer system, or computer monitor. In examples that include an integrated or peripheral computer, the computer may include at least one processor 18A and associated computer-memory 20A. The computer-memory may hold instructions that cause the processor to enact any of the processes disclosed herein. In some examples, the electronic display may be a liquid-crystal display (LCD). In some examples, the electronic display may be an active-matrix organic light-emitting diode (AMOLED) display, a passive-matrix organic light-emitting diode (PMOLED) display, or virtually any other kind of electronic display. Irrespective of the display technology, capacitive touch-screen componentry of touch-screen display device 10A may be configured to sense at least one touch point 22 effected by the user. An example touch point is the point of contact between the user's fingertip 24 and sensory surface 26 of the touch-screen display device.

Figure 2:
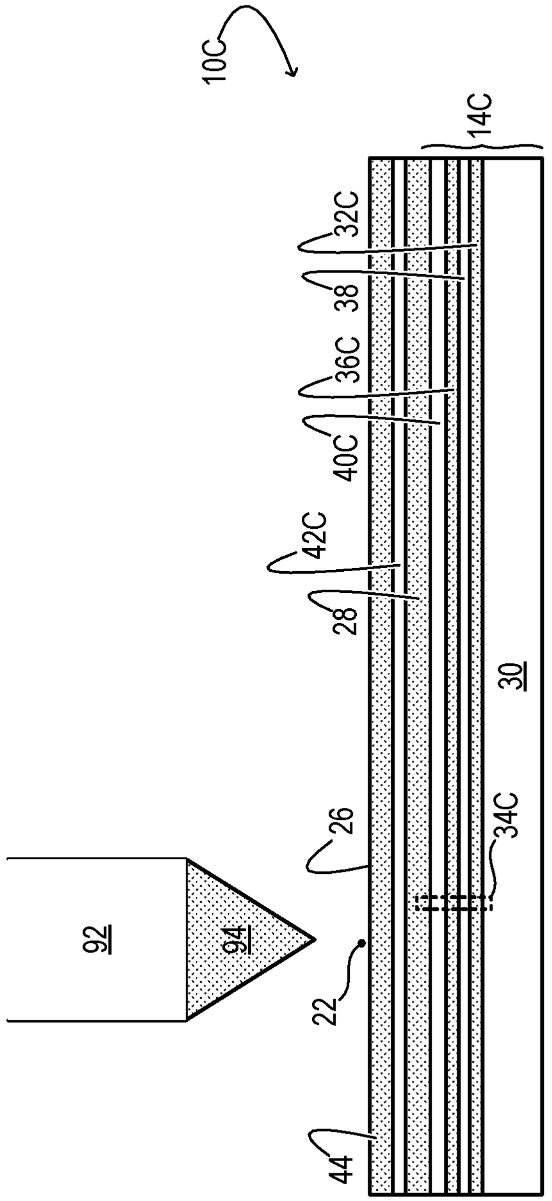
FIG. 2 shows aspects of an example touch-screen display device comprising an active-matrix OLED (AMOLED) display.
Figure 3:
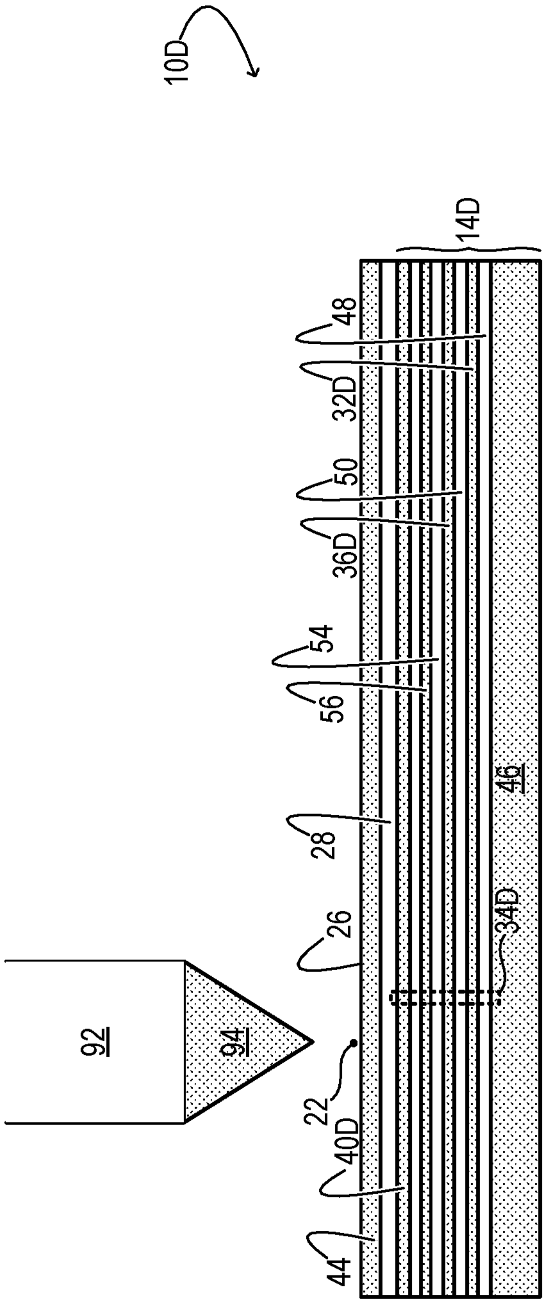
FIG. 3 shows aspects of an example touch-screen display device comprising an LCD.

FIGS. 2 and 3 show additional aspects of two different touch-screen display devices. Touch-screen display device 10C of FIG. 2 includes a capacitive touch sensor 28 arranged behind sensory surface 26, and AMOLED display 14C arranged behind the capacitive touch sensor. Capacitive touch sensor 28 is configured to sense the position of touch point 22 relative to the sensory surface. AMOLED display 14C includes a substrate 30 supporting a thin-film transistor (TFT) array 32C. The TFT array includes at least one TFT arranged at the crossing of each horizontal and vertical scan line of the display; this TFT addresses (charges and discharges) the pixel element 34C arranged at that crossing. In some examples, a second TFT may be associated with each pixel element and configured to maintain the current through that pixel element for the duration of the AMOLED refresh interval. AMOLED display 14C also includes an optically transparent common electrode (or cathode) 36C and an electroluminescent organic layer 38 arranged between the TFT array and the common electrode. In polychromatic AMOLED displays, the electroluminescent organic layer may include at least three different luminophores segregated into different pixel elements in a repeating, macropixel pattern. In FIG. 2, common electrode 36C is bonded to capacitive touch sensor 28 via a film 40C of optically clear adhesive (OCA). In some examples, the OCA film bonding the common electrode to the capacitive touch sensor may be 5 to 10 micrometers (μm) in thickness. A second film 42C of OCA may be used to bond capacitive touch sensor 28 to cover glass 44.

Touch-screen display device 10D of FIG. 3 includes a capacitive touch sensor 28 arranged behind sensory surface 26, with LCD 14D arranged behind the capacitive touch sensor. In the example shown in FIG. 3, backlighting for LCD 14D originates in light-guide plate (LGP) 46 and illuminates polarizer 48 via a series of reflectors, diffusers, and/or prismatic films. Polarizer 48 selects light of a desired polarization state for entry into TFT array 32D. TFT array 32D supports a nematic liquid-crystal film 50 capable of selectively rotating the plane of polarization of the backlighting in response to external bias applied to the individual light-releasing pixel elements 34D of the TFT array. The nematic liquid-crystal film is bounded on the opposite side by optically transparent common electrode 36D. Polarized light from each pixel element passes through the common electrode and through color-filter (CF) 54, which includes an array of CF elements positioned in registry with the pixel elements 34D, and then through second polarizer 56 where light of the undesired polarization state is blocked. The second polarizer is bonded to capacitive touch sensor 28 by via film 40D of optically clear adhesive (OCA). Continuing improvement in LCD manufacturing enables CF 54, second polarizer 56, and OCA film 40D to be made increasingly thin.

Figure 4:
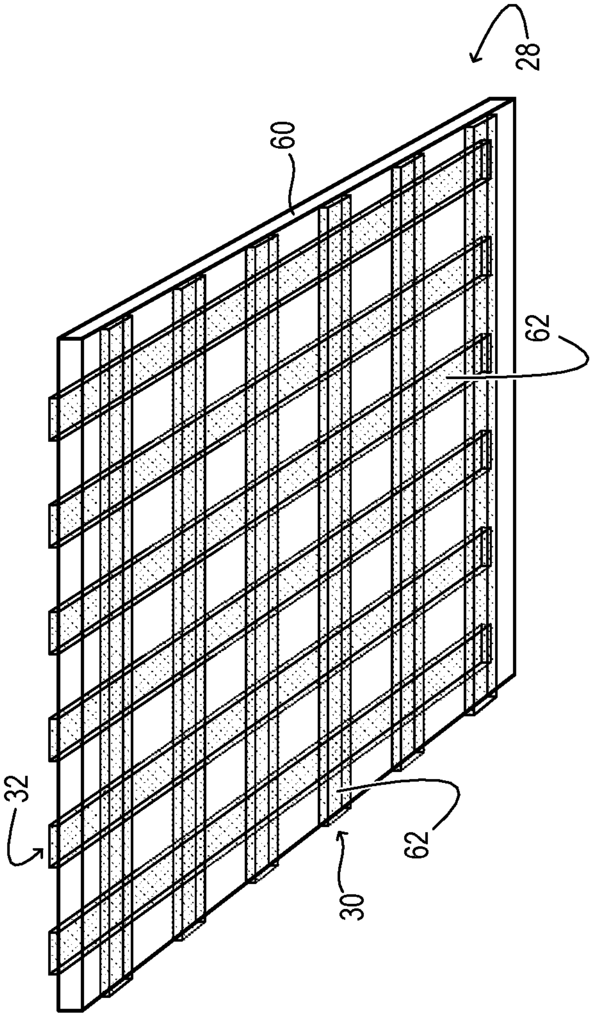
FIGS. 4 and 5 show aspects of an example capacitive touch sensor of a touch-screen display device.

FIG. 4 shows aspects of an example capacitive touch sensor 28 in expanded detail. The capacitive touch sensor comprises a series of row electrodes 30 that crosses a series of column electrodes 32. Touch screens here contemplated may include any number N of row electrodes and any number M of column electrodes. Although it is customary to have the row electrodes aligned horizontally and the column electrodes aligned vertically, that aspect is in no way necessary, as the terms 'row' and 'column' may be exchanged everywhere in this description. In the illustrated example, the series of row electrodes 30 is arranged on one face of a dielectric layer 60, and the series of column electrodes 32 is arranged on the opposite face of the dielectric layer. The dielectric layer may be 50 to 100 μm in some examples, although other thickness ranges are also envisaged. The dielectric layer may comprise a polymer film. In one non-limiting example, the dielectric layer comprises polyethylene terephthalate (PET). In curved, flexible and/or bendable touch-screen displays, the dielectric layer may be curved, flexible and/or bendable. Row electrodes 30 and column electrodes 32 each comprise electronically conductive material 62 distributed in the form of narrow (e.g., one mm-wide), elongate bands on the opposite faces of dielectric layer 60. Adjacent electrodes may be separated by one to five millimeters in some examples. The composition of electronically conductive material 62 is not particularly limited. The electronically conductive material may comprise a metallic microwire mesh, a metal-particle or metal-island film, or a film of a degenerately doped semiconductor, such as indium-tin oxide (ITO), for instance. Irrespective of the implementation, a capacitive touch sensor comprising row and column electrodes of relatively low resistance and high optical transmittance is desirable.

Figure 5:
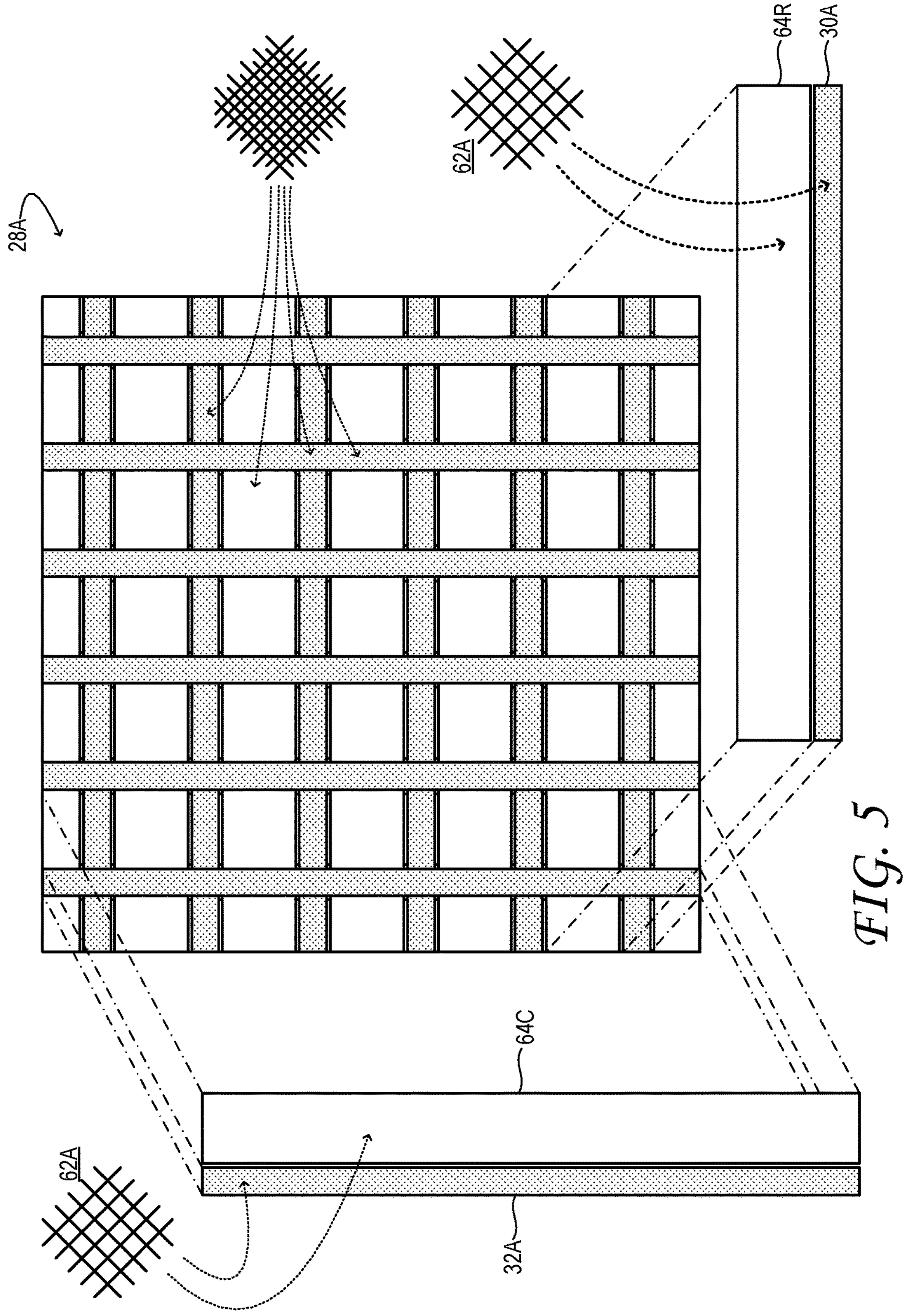

Turning now to FIG. 5, one desirable form of the electronically conductive material is a microwire mesh 62A, which embodies row electrodes 30A and column electrodes 32A of capacitive touch sensor 28A. Certain non-limiting examples of a microwire mesh comprise silver wires about 1.5 to 5 μm in diameter. In some examples, the cell pattern of the microwire mesh may be registered geometrically to the pixel pattern of the underlying display so as to avoid undesirable Moiré-type effects. To avoid the appearance of criss-crossed dark bands corresponding to row electrodes 30A and column electrodes 32A, an arrangement of electronically non-functional optical attenuators 64 may be used to improve display uniformity through the capacitive touch sensor. In the illustrated example, electronically non-functional optical attenuators 64R are positioned between adjacent row electrodes 30A, and electronically non-functional optical attenuators 64C are positioned between adjacent column electrodes 32A. In the illustrated example, the electronically non-functional optical attenuators comprise disconnected patches of microwire mesh 62A. When embodied as microwire mesh, the electronically non-functional optical attenuators may also be registered geometrically to the pixel pattern of the underlying display.

Figure 6:
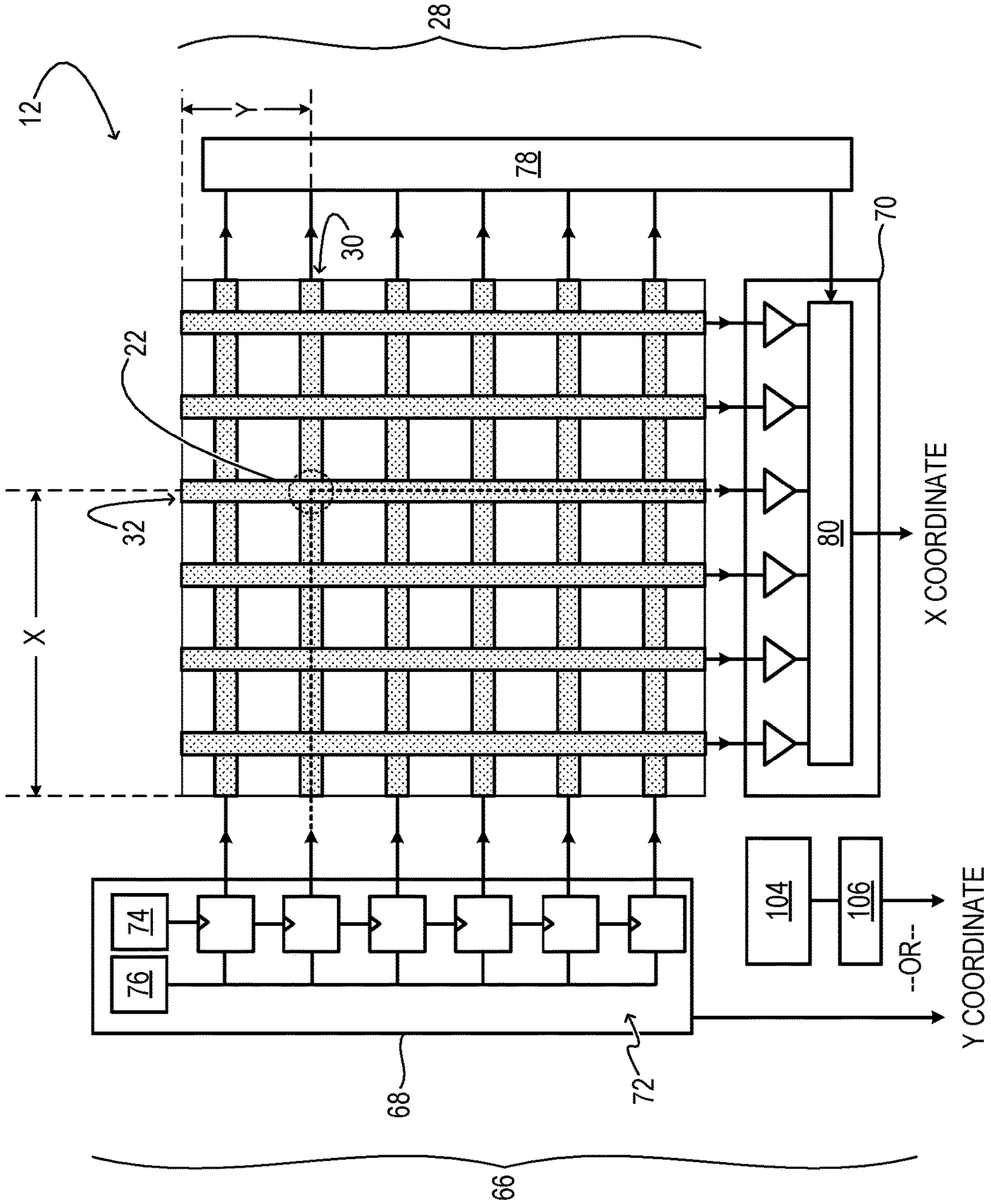
FIG. 6 shows aspects of example touch-screen logic of a touch-screen display device.

Turning now to FIG. 6, row electrodes 30 and column electrodes 32 of capacitive touch sensor 28 are addressed by touch-screen logic 66. The touch-screen logic is configured to sense user contact on or near the sensory surface of the touch-screen display device, including coordinates X, Y directly beneath a point of contact of a finger, touch-screen stylus, or other touch input on the sensory surface. To that end, the touch-screen logic includes row-drive circuit 68 and column-sense circuit 70. The terms 'row-drive' and 'column-sense' are appropriate for configurations in which signal is driven through the row electrodes and sensed via the column electrodes. Naturally, the opposite configuration is equally envisaged.

Column-sense circuit 70 is configured to sense a column signal from the series of column electrodes 32. In the illustrated example, the column-sense circuit includes M column amplifiers, each coupled to a corresponding column electrode. Row-drive circuit 68 includes a row counter 72 in the form of an N-bit shift register with outputs driving each of N row electrodes 30. The row counter is clocked by row-driver clock 74. The row counter includes a blanking input to temporarily force all output values to zero irrespective of the values stored within the shift-register. Excitation of one or more rows may be provided by filling the row counter with ones at every output to be excited, and zeroes elsewhere, and then toggling the blanking signal with the desired modulation from modulation clock 76. In the illustrated example, the output voltage may take on only two values, corresponding to the one or zero held in each bit of the row counter. In other examples, the output voltage may take on a greater range of values, to reduce the harmonic content of the output waveforms or decrease radiated emissions, for instance. In some examples, row-drive circuit 68 may include one or more additional registers offset with respect to row counter 72 and blanked by modulation clocks of different frequencies. Such variants enable concurrent excitation of two or more row electrodes (e.g., electrodes separated by a fixed number of intervening rows).

Row-drive circuit 68 of FIG. 6 applies an excitation pulse to each row electrode 30 in sequence. In this manner, the row-drive circuit is configured to concurrently drive one or more row electrodes of the series of row electrodes while leaving undriven one or more other row electrodes of the series of row electrodes. During a period in which the sensory surface is untouched, none of the column amplifiers registers an above-threshold output. However, the electrical impedance at each crossing of a row electrode 30 and a column electrode 32 is responsive to the proximity of a finger or stylus to that crossing: when the user places a fingertip on the sensory surface, the fingertip capacitively couples one or more row electrodes 30 proximate to (e.g., crossing) touch point 22 to one or more column electrodes 32 also proximate to the touch point. The capacitive coupling induces an above-threshold signal from the column amplifiers associated with the column electrodes behind the touch point. Column-sense circuit 70 returns, as the X coordinate of the touch point, the numeric value of the column providing the greatest signal received. Touch-screen logic 66 determines which row was being excited when the greatest signal was received and returns the numeric value of that row as the Y coordinate of the touch point.

Column-sense circuit 70 may also return a Z coordinate that varies in dependence on the strength of the signal received at coordinates X, Y. Accordingly, touch-screen logic 66 may distinguish firm touch, associated with strong signal, from light touch, associated with weaker signal, and from hover, associated with still weaker but detectable signal.

Returning briefly to FIGS. 2 and 3, an insulated conductor (or degenerately doped semiconductor) such as common electrodes 36C or 36D may capacitively couple the series of row electrodes 30 to the series of column electrodes 32 of capacitive touch sensor 28 absent touch of a finger or stylus. Such coupling adds an undesired component to the column signal from column electrodes 32. Operative at frequencies used to drive the touch-screen electrodes, the unwanted coupling increases with increasing thinness of the dielectric layer (or layers) that separate the touch-screen electrodes from the common electrode of the underlying electronic display. As noted above, the insulated conductor comprising common electrode 36C of AMOLED display 14A may reside just microns from the series of row electrodes 30 of capacitive touch sensor 28 (or of the series of column electrodes 32, whichever is nearer). In some examples, the effects of unwanted capacitive coupling are significant in touch-screen display devices where the common electrode of the display is less than 50 μm separated from the row or column electrodes. Such effects are even more pronounced when the common electrode resides still closer (e.g., within 20 μm) from the row or column electrodes.

Figure 7:
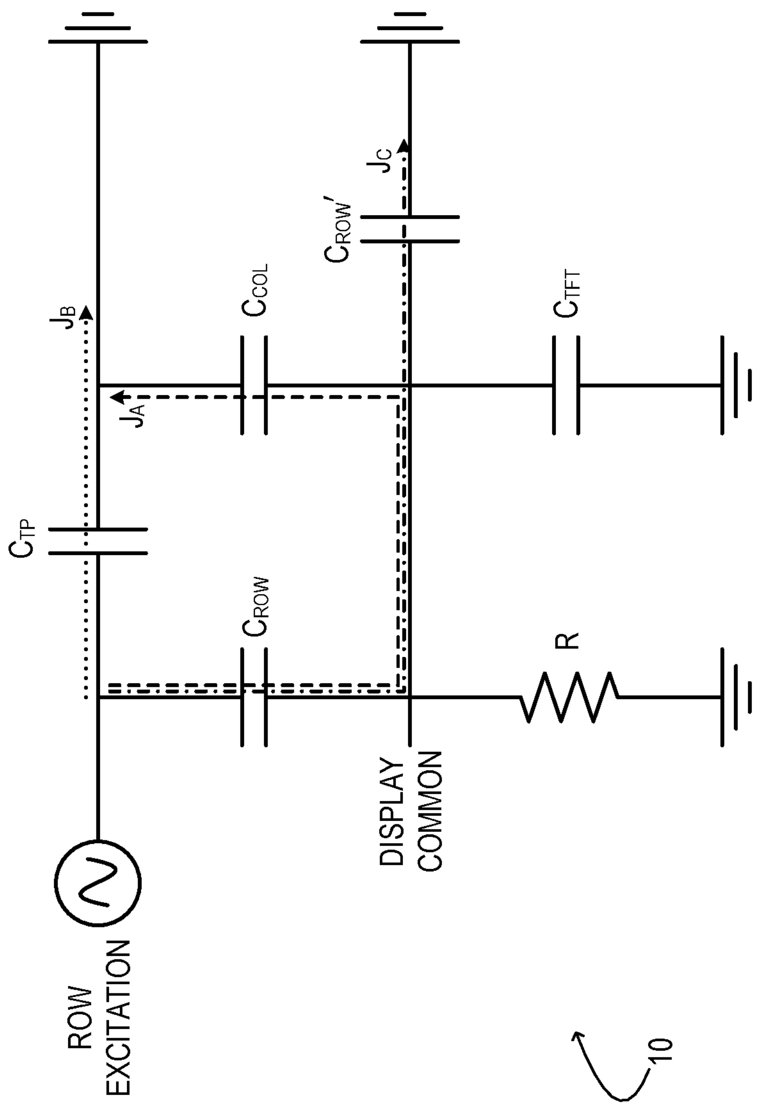
FIG. 7 provides a simplified, schematic equivalent-circuit diagram of a portion of a touch-screen display device.

Capacitive coupling via the common electrode of the electronic display is illustrated in FIG. 7, which provides a simplified, schematic equivalent-circuit diagram of a portion of a touch-screen display device 10. In particular, capacitive coupling via $C_{ROW}$ and $C_{COL}$ offers an undesirable low-impedance path (dashed line $J_A$) between the one or more row electrodes excited by the row-drive circuit and one or more column electrodes through which the touch point is sensed. This low-impedance path adds an undesired component to the signal (dotted line $J_B$) resulting from capacitive coupling through $C_{TP}$, the user's finger, stylus, or other input device, thereby decreasing the touch sensitivity. For instance, if expected touch effect is $\Delta C_j/C_j$, where $C_j$ is the capacitance between the excited row electrode and column electrode j, then addition of the undesired component reduces it to $\Delta C_j/(C_j+C_p)$, where $C_p$ is the capacitance between the excited row electrode and the common electrode of the display. The reduction in sensitivity becomes more significant at higher frequencies—e.g., the relative touch effect may be 20% at 50 kHz but only 8% at 300 kHz. Moreover, reduction in the intrinsic touch sensitivity of the capacitive touch sensor exposes the system undesirably to the effects of operational variables, such as touch position across the panel as well as external (e.g., thermal) stresses.

Typically, the undesired component arising from capacitive coupling with the common electrode of the electronic display cannot be assumed to be invariant over time or across the range of expected use scenarios of touch-screen display device 10. Rather, the undesired component is a function of minute dimensional and impedance changes that occur over relatively long timescales during the service life of the touch-screen display device. Accordingly, the undesired component may vary in dependence on the lifetime usage of the touch-screen display device. Additional dimensional and impedance changes may occur over relatively short timescales, such as during device warm-up, and pursuant to use scenarios in which the device is subjected to mechanical stress (e.g. dropping, bending, compression, etc.). More generally, the undesired component may vary in dependence on any use condition of the touch-screen display device.

Turning back to FIG. 6, touch-screen logic 66 includes additional componentry configured to address the issues described above. In particular, the touch-screen logic includes row-sense circuit 78 and correction circuit 80. These additional circuits operate in sympathy with state-of-the-art row-drive strategies, wherein each row electrode is excited in a predetermined sequence while other row electrodes remain undriven. Row-sense circuit 78 is configured to sense a row signal from one or more of the undriven, other row electrodes (dot-dashed line $J_C$ in FIG. 7). By inference, the signal sensed on undriven row electrodes (particularly on rows that are far from the touch point) is due primarily to capacitive coupling to the excited row electrode(s), via the common electrode of the display. It follows that the row signal correlates to the undesired component superposed on the column electrodes. More particularly, the magnitude of the signal sensed on the undriven row electrodes will track the undesired component, as both components share the same origin. Accordingly, it is possible to estimate the level of the undesired component on the sensed column-electrode signal based at least partly on the row signal sensed on the undriven row electrodes.

To that end, correction circuit 80 is configured to provide a corrected column output based at least partly on the column signal and on the row signal as defined above. The estimate of the undesired component of the column-electrode signal can be compensated in real time, resulting in improved touch sensitivity. In some examples, correction circuit 80 is configured to obtain the corrected column output by subtracting the estimate from the column signal, where the estimate is obtained by scaling the row signal. More specifically, during a calibration phase in the manufacture of a touch-screen display device, a scaling factor that defines the ratio of the undesired component to the net row signal may be estimated. That scaling factor may be stored in firmware of the touch-screen display device and used, during runtime of the touch-screen display device, by correction circuit 80, to estimate the undesired component of the column signal based at least partly on the row-sense signal. In some examples, the scaling factor may be a real-valued parameter value—e.g., a value that assumes a negligible phase offset between the row signal and the undesired-component estimate. In other examples, the scaling factor may be complex-valued, such that the scaling factor takes into account an expected phase differential between the row signal and the undesired-component estimate. In some examples, the scaling factor may be a function of one or more operational parameters of the touch-screen display device, such as lifetime usage, the presence of a palm on the sensory surface, or the orientation in which the device is being held.

In some examples the row signal may be a signal sensed on a single row electrode 30 of capacitive touch sensor 28—e.g., a row electrode separated from the excited electrode by a fixed number of rows. In other examples, the row signal may be an aggregate of row signals sensed on a plurality of row electrodes—e.g., a simple or weighted average of signals from each of the undriven row electrodes or from a pre-determined distribution thereof. In these examples, the average may be weighted in such a manner as to de-emphasize the contribution from row electrodes that are closest to the excited row electrode(s)—as the user's touch point will exaggerate the capacitive coupling to electrodes nearest to the exited row. Accordingly, the series of row electrodes 30 may include one or more intervening row electrodes arranged between the one or more row electrodes driven by the row-drive circuit and the one or more undriven, other row electrodes used in the estimate.

In some examples, correction circuit 80 may be implemented using analog processing, at least in part. The correction circuit may include operational amplifiers and/or analog arithmetic componentry, for instance. In some examples, the correction circuit may be implemented digitally, at least in part. Computer memory of a touch-screen display device may store a look-up table populated by an array of undesired-component estimates or corrected column-sense values, for instance. The look-up table may be indexed by bracketing values that correspond to the row-sense signal and/or column signal, for example. Thus the correction circuit may be configured to retrieve the corrected column output from an electronically stored look-up table.

Figure 8:
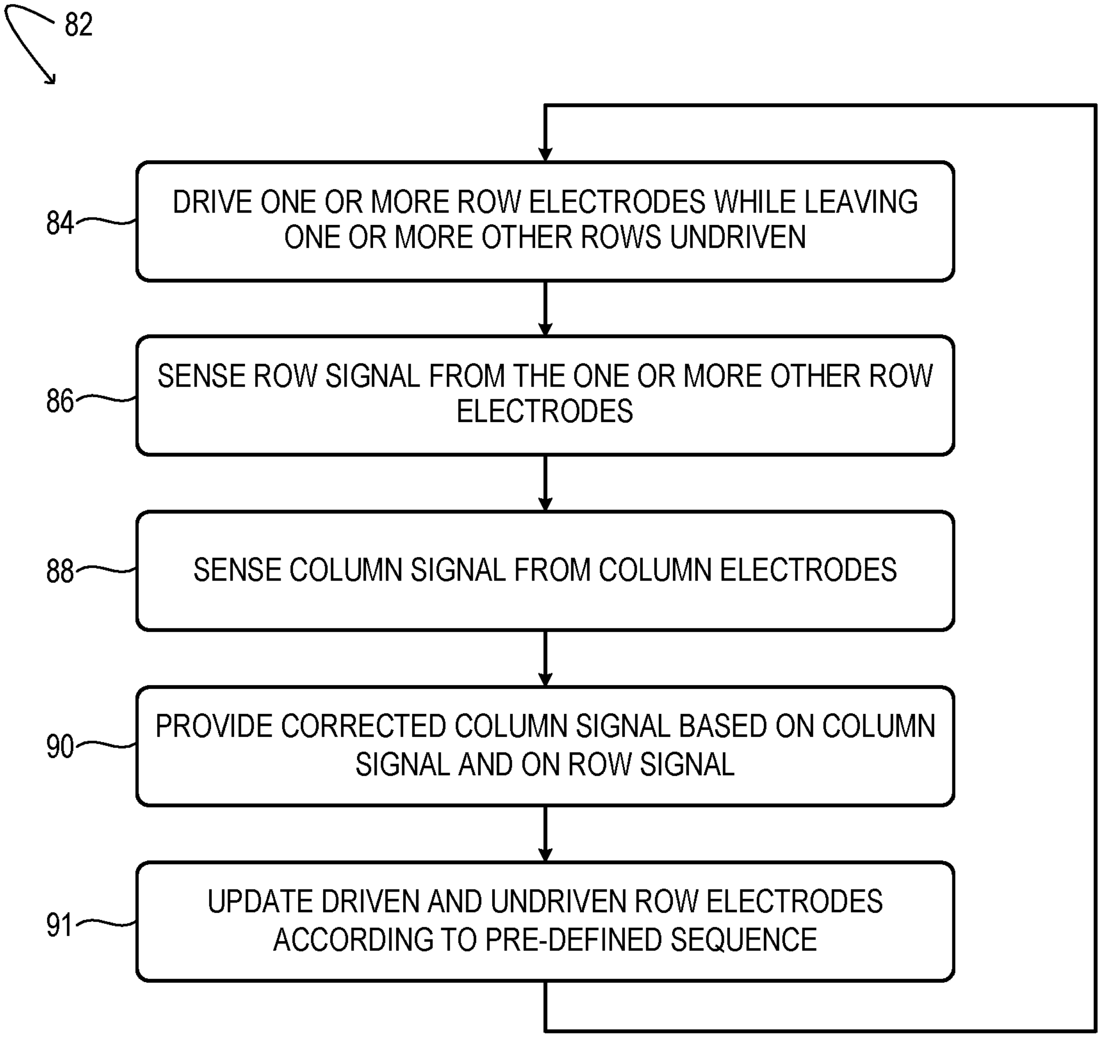
FIG. 8 shows aspects of an example method to process touch input on a touch-screen display device.

FIG. 8 shows aspects of an example method 82 to process touch input on a touch-screen display device having an electronic display layer arranged behind a series of column electrodes and behind a series of row electrodes. As noted above, the electrical impedance at each crossing of a row and column electrode is responsive to proximity of a touch input (e.g., finger or stylus tip) to that crossing. The method may be supported by the touch-screen display-device configurations described herein, or by other configurations.

At 84 of method 82, one or more row electrodes of the series of row electrodes of a capacitive touch sensor are driven while one or more other row electrodes of the series of row electrodes are left undriven. At 86 a row signal is sensed on one or more of the row electrodes that are not currently excited by the row-drive circuit. As noted above, the electrical impedance at each crossing of a row and column electrode is responsive to proximity of a touch input (e.g., finger or stylus tip) to that junction. At 88, accordingly, a column signal is sensed on the series of column electrodes of the capacitive touch sensor. At 90 a corrected column output is provided. The corrected column output is based at least partly on the column signal and on the row signal, as described hereinabove. At 91 of method 82, the selection of driven and undriven row electrodes is iteratively updated (e.g., incremented) according to the pre-defined row-drive sequence.

Returning briefly to FIG. 1, touch-screen stylus 92A may be used in lieu of the user's fingertip to execute touch input on touch-screen display device 10A. Accordingly, capacitive touch sensor 28 of the touch-screen display device may be configured to sense a relative position of the tip 94 of the touch-screen stylus relative to sensory surface 26 of the touch-screen display device. Like the user's fingertip, the tip of a passive touch-screen stylus comprises a high dielectric-constant material that capacitively couples the row and column electrodes under the touch point. A passive touch-screen stylus offers better touch accuracy than the fingertip, and may reduce smudging of the sensory surface. Although it is typical for a touch-screen stylus to take the form of an elongate cylinder or pen, that aspect is not strictly necessary. FIG. 1 shows an alternatively shaped touch-screen input device 92B usable on a large-format touch-screen display device 10B. It will be noted that touch-screen input devices of various shapes and sizes are envisaged herein and all references to a stylus equally apply to other touch-screen input devices.

Figure 9:
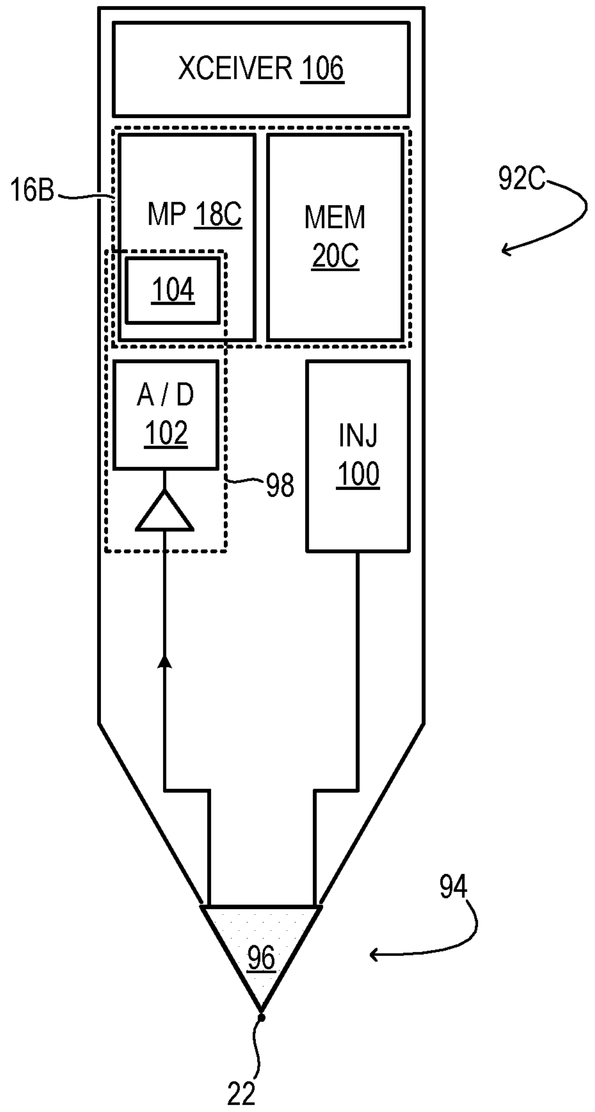
FIG. 9 shows aspects of an example active touch-screen stylus.

Relative to a passive stylus, an active touch-screen stylus offers even greater touch accuracy, in addition to faster and more accurate tracking of the touch point. In FIG. 9, probe electrode 96 is arranged at tip 94 of active touch-screen stylus 92C. The probe electrode is coupled operatively to associated sensory logic 98 and injection logic 100. The sensory and injection logic are coupled operatively to, and may be embodied partially within, microprocessor 18C. The microprocessor may be configured for digital signal processing (DSP) and associated with computer memory 20C. Sensory logic 98 includes linear analog componentry configured to maintain the probe electrode 96 at a constant voltage and to convert any current into or out of the probe electrode into a proportional current-sense voltage. The sensory logic may include an analog-to-digital (A/D) converter 102 that converts the current-sense voltage into digital data to facilitate subsequent processing.

Instead of capacitively coupling row and column electrodes of the capacitive touch sensor via a dielectric, sensory logic 98 of touch-screen stylus 92C senses the arrival of an excitation pulse from row electrode 30, behind touch point 22, and in response, injects charge into column electrode 32, also behind the touch point. To this end, injection logic 100 is associated with the probe electrode 96 and configured to control charge injection from the probe electrode 96 to the column electrode directly beneath the probe electrode. The injected charge appears, to column-sense circuit 70 of the capacitive touch sensor 28, similar to an electrostatic pulse delivered via capacitive coupling of the column electrode 32 to an energized row electrode 30 intersecting at touch point 22.

In some examples, sensory logic 98 and injection logic 100 are active during non-overlapping time windows of each touch-sensing frame, so that charge injection and charge sensing may be enacted at the same probe electrode 96. In this implementation, touch-screen logic 66 excites the series of row electrodes 30 during the time window in which the sensory logic is active, but suspends row excitation during the time window in which the touch-screen stylus 92C may inject charge. This strategy provides an additional advantage, in that it enables touch-screen logic 66 to distinguish touch points effected by touch-screen stylus 92C from touch points effected by a fingertip or palm. If column-sense circuit 70 detects charge from a column electrode 32 during the charge-injection time window of the touch-screen stylus 92C (when none of the row electrodes 30 are excited), then touch point 22 detected must be a touch point of the touch-screen stylus. However, if the column-sense logic detects charge during the charge-sensing window of the touch-screen stylus (when row electrodes 30 are being excited), then the touch point detected may be a touch point of a fingertip, hand, or passive touch-screen stylus, for example.

Active sensing followed by charge injection enables a touch point 22 of a very small area to be located precisely, and without requiring long integration times that would increase the latency of touch sensing. For example, when receiving the signal from row electrode 30, the touch-screen stylus 92C may inject a charge pulse with amplitude proportional to the received signal strength. Thus, capacitive touch sensor 28 may receive the electrostatic signal from touch-screen stylus 92C and calculate the Y coordinate, which may be the row providing the greatest signal from the touch-screen stylus, or a function of the signals received at that row and adjacent rows. Nevertheless, this approach introduces various challenges. The major challenge is that the sensory logic 98 and injection logic 100 must operate simultaneously—i.e., in full-duplex mode. Various methods—for example, code division or frequency division multiple access—may be applied to cancel the strong interference at the receiving direction from the transmitting direction. The capacitive touch sensor may be required to receive two signals simultaneously (one from the row electrode 30, and the other from the touch-screen stylus probe electrode 96). The system may also work by time-division, but at a cost in available integration time.

Another solution is to require touch-screen stylus 92C to assume a more active role in determining the touch point coordinates. In the illustrated example, sensory logic 98 of the touch-screen stylus 92C includes a local row counter 104, which is maintained in synchronization with row counter 72 (hereinafter, the remote row counter) of touch-screen logic 66. This feature gives the touch-screen stylus and the touch screen a shared sense of time, but without being wired together.

When probe electrode 96 touches the sensory surface, sensory logic 98 receives a waveform that lasts as long as the touch is maintained. The waveform acquires maximum amplitude at the moment in time when row electrode 30, directly beneath (i.e., adjacent) the probe electrode 96, has been energized. Sensory logic 98 is configured to sample the waveform at each increment of the local row counter 104 and determine when the maximum amplitude was sensed. This determination can be made once per frame, for example.

Because touch-screen stylus 92C and touch screen logic 66 have shared timing due to synchronized row counters, the state of local row-counter 104 at maximum sensed amplitude reports directly on the row coordinate—i.e., the Y coordinate—of touch point 22. In order to make use of this information, the Y coordinate must be communicated back to touch-screen logic 66. To this end, the touch-screen stylus includes transceiver 106 configured to wirelessly communicate the computed row coordinate to row-sense logic of the touch screen. This disclosure embraces various modes of communicating data, including the Y coordinate, from the touch-screen stylus to the touch screen.

As noted above, the control methods herein may be tied to a computer system of one or more computing devices. Such methods and processes may be implemented as an application program or service, an application programming interface (API), a library, and/or other computer-program product.

Figure 10:
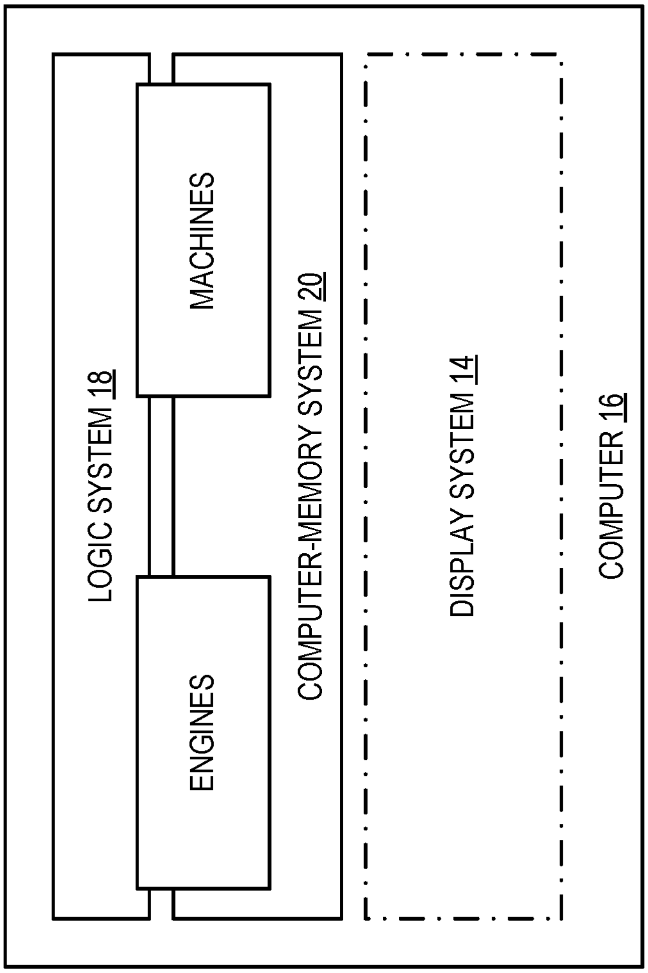
FIG. 10 shows aspects of an example computer configured to process touch input on a touch-screen display device.

FIG. 10 provides a schematic representation of an example computer 16 configured to provide some or all of the computer system functionality disclosed herein. In the description above, computer 16 may be embodied as computer 16A of touch-screen display device 10A and/or computer 16B of touch-screen stylus 92C. Computer 16 of FIG. 10 includes a logic system 18 and a computer-memory system 20. Computer 16 may also include a display system 14 and other systems not shown in the drawings.

Logic system 18 includes one or more physical devices configured to execute instructions. For example, the logic system may be configured to execute instructions that are part of at least one operating system (OS), application, service, and/or other program construct. The logic system may include at least one hardware processor (e.g., microprocessor, central processor, central processing unit (CPU) and/or graphics processing unit (GPU)) configured to execute software instructions. Additionally or alternatively, the logic system may include at least one hardware or firmware device configured to execute hardware or firmware instructions. A processor of the logic system may be single-core or multi-core, and the instructions executed thereon may be configured for sequential, parallel, and/or distributed processing. Individual components of the logic system optionally may be distributed among two or more separate devices, which may be remotely located and/or configured for coordinated processing. Aspects of the logic system may be virtualized and executed by remotely-accessible, networked computing devices configured in a cloud-computing configuration.

Computer-memory system 20 includes at least one physical device configured to temporarily and/or permanently hold computer system information, such as data and instructions executable by logic system 18. When the computer-memory system includes two or more devices, the devices may be collocated or remotely located. Computer-memory system 20 may include at least one volatile, nonvolatile, dynamic, static, read/write, read-only, random-access, sequential-access, location-addressable, file-addressable, and/or content-addressable computer-memory device. Computer-memory system 20 may include at least one removable and/or built-in computer-memory device. When the logic system executes instructions, the state of computer-memory system 20 may be transformed—e.g., to hold different data.

Aspects of logic system 18 and computer-memory system 20 may be integrated together into one or more hardware-logic components. Any such hardware-logic component may include at least one program- or application-specific integrated circuit (PASIC/ASIC), program- or application-specific standard product (PSSP/ASSP), system-on-a-chip (SOC), or complex programmable logic device (CPLD), for example.

Logic system 18 and computer-memory system 20 may cooperate to instantiate one or more logic machines or engines. As used herein, the terms 'machine' and 'engine' each refer collectively to a combination of cooperating hardware, firmware, software, instructions, and/or any other components that provide computer system functionality. In other words, machines and engines are never abstract ideas and always have a tangible form. A machine or engine may be instantiated by a single computing device, or a machine or engine may include two or more subcomponents instantiated by two or more different computing devices. In some implementations, a machine or engine includes a local component (e.g., a software application executed by a computer system processor) cooperating with a remote component (e.g., a cloud computing service provided by a network of one or more server computer systems). The software and/or other instructions that give a particular machine or engine its functionality may optionally be saved as one or more unexecuted modules on one or more computer-memory devices.

Machines and engines may be implemented using any suitable combination of machine learning (ML) and artificial intelligence (AI) techniques. Non-limiting examples of techniques that may be incorporated in an implementation of one or more machines include support vector machines, multi-layer neural networks, convolutional neural networks (e.g., spatial convolutional networks for processing images and/or video, and/or any other suitable convolutional neural network configured to convolve and pool features across one or more temporal and/or spatial dimensions), recurrent neural networks (e.g., long short-term memory networks), associative memories (e.g., lookup tables, hash tables, bloom filters, neural Turing machines and/or neural random-access memory) unsupervised spatial and/or clustering methods (e.g., nearest neighbor algorithms, topological data analysis, and/or k-means clustering), and/or graphical models (e.g., (hidden) Markov models, Markov random fields, (hidden) conditional random fields, and/or AI knowledge bases)).

When included, display system 14 may be used to present a visual representation of data held by computer-memory system 20. The visual representation may take the form of a graphical user interface (GUI) in some examples. The display system may include one or more display devices utilizing virtually any type of technology. In some examples, display system may include one or more virtual-, augmented-, or mixed reality displays.

To further summarize, one aspect of this disclosure is directed to a touch-screen display device comprising a series of column electrodes, a series of row electrodes, an electronic display layer, a row-drive circuit, a row-sense circuit, a column-sense circuit, and a correction circuit. The series of row electrodes crosses the series of column electrodes such that an electrical impedance at each crossing of a row and column electrode is responsive to proximity of a touch input to that crossing. The electronic display layer is arranged behind the series of column electrodes and behind the series of row electrodes. The row-drive circuit is configured to concurrently drive one or more row electrodes of the series of row electrodes while leaving undriven one or more other row electrodes of the series of row electrodes. The row-sense circuit is configured to sense a row signal from the one or more other row electrodes. The column-sense circuit is configured to sense a column signal from the series of column electrodes, and the correction circuit is configured to provide a corrected column output based at least partly on the column signal and on the row signal.

In some implementations, the electronic display layer includes an insulated conductor, and the insulated conductor capacitively couples the series of row electrodes to the series of column electrodes absent the touch input, thereby adding an undesired component to the column signal. In some implementations, the insulated conductor is within 50 microns of the nearer of the series of row electrodes and the series of column electrodes. In some implementations, the undesired component varies in dependence on lifetime usage of the touch-screen display device. In some implementations, the undesired component varies in dependence on a use condition of the touch-screen display device. In some implementations, the row signal correlates to the undesired component. In some implementations, the correction circuit is configured to obtain the corrected column output by subtracting an estimate of the undesired component from the column signal, wherein the estimate is obtained by scaling the row signal. In some implementations, the correction circuit is configured to retrieve the corrected column output from an electronically stored look-up table. In some implementations, the series of row electrodes includes one or more intervening row electrodes arranged between the one or more row electrodes driven by the row-drive circuit and the one or more other row electrodes left undriven. In some implementations, the electronic display layer includes an active-matrix organic light-emitting diode layer.

Another aspect of this disclosure is directed to a method to process touch input on a touch-screen display device having an electronic display layer arranged behind a series of column electrodes and behind a series of row electrodes. The method comprises: concurrently driving one or more row electrodes of the series of row electrodes while leaving undriven one or more other row electrodes of the series of row electrodes; sensing a row signal from the one or more other row electrodes; sensing a column signal from the series of column electrodes, wherein an electrical impedance at each crossing of a row and column electrode is responsive to proximity of the touch input to that crossing; and providing a corrected column output based at least partly on the column signal and on the row signal.

In some implementations, the electronic display layer includes an insulated conductor or degenerately doped semiconductor, which capacitively couples the series of row electrodes to the series of column electrodes absent the touch input, thereby adding an undesired component to the column signal. In some implementations, the insulated conductor or degenerately doped semiconductor is within 50 microns of the nearer of the series of row electrodes and the series of column electrodes. In some implementations, the undesired component varies in dependence on lifetime usage of the touch-screen display device. In some implementations, the undesired component varies in dependence on a use condition of the touch-screen display device. In some implementations, the row signal correlates to the undesired component. In some implementations, providing the corrected column output includes obtaining the corrected column output by subtracting an estimate of the undesired component from the column signal, wherein the estimate is obtained by scaling the row signal. In some implementations, providing the corrected column output includes retrieving the corrected column output from an electronically stored look-up table. In some implementations, the row signal is one of a plurality of row signals sensed from a corresponding plurality of the one or more other row electrodes of the series of row electrodes, and the corrected column output is based at least partly on each of the plurality of row signals.

Another aspect of this disclosure is directed to a touch-screen display device comprising a series of column electrodes, a series of row electrodes, an electronic display layer, a row-drive circuit, a row-sense circuit, a column-sense circuit, and a correction circuit. The series of row electrodes crosses the series of column electrodes such that an electrical impedance at each crossing of a row and column electrode is responsive to proximity of a touch input to that crossing. The electronic display layer is arranged behind the series of column electrodes and behind the series of row electrodes. The row-drive circuit is configured to concurrently drive one or more row electrodes of the series of row electrodes while leaving undriven one or more other row electrodes of the series of row electrodes. The row-sense circuit is configured to sense a row signal from the one or more other row electrodes. The column-sense circuit is configured to sense a column signal from the series of column electrodes, and the correction circuit is configured to provide a corrected column output based at least partly on the column signal and on the row signal. In this touch-screen display device, the electronic display layer includes an insulated, degenerately doped semiconductor, and the insulated, degenerately doped semiconductor capacitively couples the series of row electrodes to the series of column electrodes absent the touch input, thereby adding an undesired component to the column signal.

This disclosure is presented by way of example and with reference to the attached drawing figures. Components, process steps, and other elements that may be substantially the same in one or more of the figures are identified coordinately and are described with minimal repetition. It will be noted, however, that elements identified coordinately may also differ to some degree. It will be further noted that the figures are schematic and generally not drawn to scale. Rather, the various drawing scales, aspect ratios, and numbers of components shown in the figures may be purposely distorted to make certain features or relationships easier to see.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A touch-screen display device comprising:

a series of column electrodes;

a series of row electrodes crossing the series of column electrodes such that an electrical impedance at each crossing of a row and column electrode is responsive to proximity of a touch input to that crossing;

an electronic display layer arranged behind the series of column electrodes and behind the series of row electrodes;

a row-drive circuit configured to concurrently drive one or more row electrodes of the series of row electrodes while leaving undriven one or more other row electrodes of the series of row electrodes, the row-drive circuit coupled to a first end of the row electrodes;

a row-sense circuit separate from the row-drive circuit, the row-sense circuit configured to sense a row signal from the one or more other row electrodes, the row-sense circuit coupled to a second end of the row electrodes opposite to the row-drive circuit;

a column-sense circuit configured to sense a column signal from the series of column electrodes; and a correction circuit coupled to the row-sense circuit, the correction circuit configured to estimate an undesired component of the column signal by scaling the row signal from the row-sense circuit by a complex-valued scaling factor and to provide a corrected column output based at least partly on the column signal and on the estimate of the undesired component.

2. The touch-screen display device of claim 1, wherein the electronic display layer includes an insulated conductor, and wherein the insulated conductor capacitively couples the series of row electrodes to the series of column electrodes absent the touch input, thereby adding the undesired component to the column signal.

3. The touch-screen display device of claim 2 wherein the insulated conductor is within 50 microns of the nearer of the series of row electrodes and the series of column electrodes.

4. The touch-screen display device of claim 1 wherein the undesired component varies in dependence on lifetime usage of the touch-screen display device.

5. The touch-screen display device of claim 1 wherein the undesired component varies in dependence on a use condition of the touch-screen display device.

6. The touch-screen display device of claim 1 wherein the row signal correlates, after scaling, to the undesired component.

7. The touch-screen display device of claim 1 wherein the correction circuit is configured to obtain the corrected column output by subtracting the estimate of the undesired component from the column signal.

8. The touch-screen display device of claim 1 wherein the correction circuit is configured to retrieve the corrected column output from an electronically stored look-up table.

9. The touch-screen display device of claim 1 wherein the electronic display layer includes an active-matrix organic light-emitting diode layer.

10. The touch-screen display device of claim 1 wherein the series of row electrodes includes one or more intervening row electrodes arranged between the one or more row electrodes driven by the row-drive circuit and the one or more other row electrodes left undriven.

11. A method to process touch input on a touch-screen display device having an electronic display layer arranged behind a series of column electrodes and behind a series of row electrodes, the method comprising:

concurrently driving one or more row electrodes of the series of row electrodes while leaving undriven one or more other row electrodes of the series of row electrodes;

sensing a row signal from the one or more other row electrodes;

sensing a column signal from the series of column electrodes, wherein an electrical impedance at each crossing of a row and column electrode is responsive to proximity of the touch input to that crossing;

scaling the row signal by a complex-valued scaling factor to provide an estimate of an undesired component of the column signal; and providing a corrected column output based at least partly on the column signal and on the estimate of the undesired component.

12. The method of claim 11 wherein the electronic display layer includes an insulated conductor or degenerately doped semiconductor, which capacitively couples the series of row electrodes to the series of column electrodes absent the touch input, thereby adding the undesired component to the column signal.

13. The method of claim 11 wherein the insulated conductor or degenerately doped semiconductor is within 50 microns of the nearer of the series of row electrodes and the series of column electrodes.

14. The method of claim 11 wherein the undesired component varies in dependence on lifetime usage of the touch-screen display device.

15. The method of claim 11 wherein the undesired component varies in dependence on a use condition of the touch-screen display device.

16. The method of claim 11 wherein the row signal, after scaling, correlates to the undesired component.

17. The method of claim 11 wherein providing the corrected column output includes obtaining the corrected column output by subtracting the estimate of the undesired component from the column signal.

18. The method of claim 11 wherein providing the corrected column output includes retrieving the corrected column output from an electronically stored look-up table.

19. The method of claim 11 wherein the row signal is one of a plurality of row signals sensed from a corresponding plurality of the one or more other row electrodes of the series of row electrodes, and wherein the corrected column output is based at least partly on each of the plurality of row signals.

20. A touch-screen display device comprising:

a series of column electrodes;

a series of row electrodes crossing the series of column electrodes such that an electrical impedance at each crossing of a row and column electrode is responsive to proximity of a touch input to that crossing;

an electronic display layer arranged behind the series of column electrodes and behind the series of row electrodes;

a row-drive circuit configured to concurrently drive one or more row electrodes of the series of row electrodes while leaving undriven one or more other row electrodes of the series of row electrodes, the row-drive circuit coupled to a first end of the row electrodes;

a row-sense circuit separate from the row-drive circuit, the row-sense circuit configured to sense a row signal from the one or more other row electrodes, the row-sense circuit coupled to a second end of the row electrodes opposite to the row-drive circuit;

a column-sense circuit configured to sense a column signal from the series of column electrodes; and a correction circuit coupled to the row-sense circuit, the correction circuit configured to estimate an undesired component of the column signal by scaling the row signal from the row-sense circuit by a complex-valued scaling factor and to provide a corrected column output based at least partly on the column signal and on the estimate of the undesired component, wherein the electronic display layer includes an insulated, degenerately doped semiconductor, and wherein the insulated, degenerately doped semiconductor capacitively couples the series of row electrodes to the series of column electrodes absent the touch input, thereby adding the undesired component to the column signal.

* * * * *